US006495817B1

(12) United States Patent
Sato et al.

(10) Patent No.: US 6,495,817 B1
(45) Date of Patent: Dec. 17, 2002

(54) RADIATION DETECTING APPARATUS HAVING AN ELECTRODELESS REGION

(75) Inventors: Kenji Sato, Otsu (JP); Masahito Sato, Yamanashi-ken (JP)

(73) Assignees: Shimadzu Corporation, Kyoto (JP); Shindengen Electric Manufacturing Co., Ltd, Tokyo (JP); Yamanashi Electronics Co., Ltd., Yamanashi (JP)

( * ) Notice: Subject to any disclaimer, the term of this patent is extended or adjusted under 35 U.S.C. 154(b) by 106 days.

(21) Appl. No.: 09/639,086

(22) Filed: Aug. 16, 2000

(30) Foreign Application Priority Data

Aug. 26, 1999 (JP) ........................................ 11-240026

(51) Int. Cl.$^{7}$ ........................................ H01L 31/00

(52) U.S. Cl. ................................ 250/214.1; 250/208.2

(58) Field of Search ........................ 250/214.1, 208.2; 257/53, 428, 431, 444

(56) References Cited

U.S. PATENT DOCUMENTS 5,101,255 A * 3/1992 Ishioka et al. ............. 136/258
5,414,275 A * 5/1995 Sugawa et al. ............. 257/458
5,986,285 A * 11/1999 Yagi .......................... 257/103

* cited by examiner

*Primary Examiner*—Stephone Allen
*Assistant Examiner*—Bradford Hill
(74) *Attorney, Agent, or Firm*—Rader, Fishman & Grauer PLLC

(57) ABSTRACT

A carrier selective high resistance film is formed over an entire area between a thick amorphous semiconductor layer and a voltage application electrode, and an electrodeless region extends throughout a circumference of the voltage application electrode. As a result, dark currents are suppressed, without impairing signal response characteristics, by carrier selectivity of the carrier selective high resistance film. Covered by the carrier selective high resistance film, the thick amorphous semiconductor layer maintains an effective surface resistance. The electrodeless region extending circumferentially of the voltage application electrode secures a sufficient surface voltage endurance to suppress creeping discharges due to a bias voltage. Consequently, sufficient detection sensitivity is secured by applying a high bias voltage to the voltage application electrode.

10 Claims, 8 Drawing Sheets

Ve
-VA
radiation
d
2A
2
1A
1
3
4
Ca
8
6
DU
7
sensitive area radiation
Ve
$-V_A$
1A
1
2A
d
2
3
6
Ca
4
DU
7
sensitive area
8 radiation
Ve
+VA
1B
1
2A
d
2
3
6
Ca
4
DU
7
8
sensitive area

RADIATION DETECTING APPARATUS HAVING AN ELECTRODELESS REGION

BACKGROUND OF THE INVENTION (1) Field of the Invention

This invention relates to radiation detecting apparatus of the direct conversion type used in the medical, industrial, nuclear and other fields, and more particularly to a technique of suppressing creeping discharges due to a bias voltage applied to a radiation sensitive semiconductor layer.

(2) Description of the Related Art

Radiation (e.g. X rays) detecting apparatus include the indirect conversion type which first converts radiation (e.g. X rays) into light and then converts the light into electric signals by photoelectric conversion, and the direct conversion type which converts incident radiation directly into electric signals with a radiation sensitive semiconductor layer. The latter, direct conversion type apparatus has a voltage application electrode formed on a front surface of the radiation sensitive semiconductor layer to which a predetermined bias voltage is applied, and carrier collection electrodes formed on a back surface of the radiation sensitive semiconductor layer for collecting carriers generated by incident radiation. The carriers are taken out as radiation detection signals, thereby enabling a detection of the radiation.

Certain of the conventional radiation detecting apparatus of the direct conversion type employ a thick layer of an amorphous semiconductor such as amorphous selenium as the radiation sensitive semiconductor layer. An amorphous semiconductor may simply be processed to form a thick and wide layer by vacuum deposition or the like, and therefore is suited for a two-dimensional array structure requiring a large, thick layer.

As shown in FIG. 1, a conventional two-dimensional array type radiation detecting apparatus includes a thick amorphous semiconductor layer 1 for generating electron-hole pairs (carriers) in response to incident radiation, a voltage application electrode 2 formed on the front surface of semiconductor layer 1 to which a bias voltage is applied, and a plurality of carrier collection electrodes 3 arranged in a two-dimensional matrix form on the back surface of semiconductor layer 1. Each carrier collection electrode 3 has, connected thereto, a charge storing capacitor Ca and a charge reading switching element (e.g. a thin film transistor) 4 which is normally turned off. Charges accumulating in the capacitors Ca as a result of incident radiation are read as radiation detection signals through the switching elements 4 turned on.

The radiation detecting apparatus having the two-dimensional array structure shown in FIG. 1 may be used in a fluoroscopic apparatus for detecting transmitted X-ray images. In this case, fluoroscopic images are acquired based on the radiation detection signals outputted from the radiation detecting apparatus.

However, the conventional radiation detecting apparatus noted above has a drawback that the bias voltage applied to the thick amorphous semiconductor layer 1 tends to result in creeping discharges. The creeping discharges are caused by dielectric breakdowns occurring along surfaces from edges 2*a* of the voltage application electrode 2 to edges 1*a* of the thick amorphous semiconductor layer 1, before being grounded, as shown in FIG. 1.

In the case of a fluoroscopic image, for example, the creeping discharges result in noise in the radiation detection signals to become a detriment to image quality. The creeping discharges may be suppressed by reducing the bias voltage. However, an amorphous semiconductor is inferior to a single crystal semiconductor in carrier transport characteristics, and cannot demonstrate sufficient detecting sensitivity with a low bias voltage.

SUMMARY OF THE INVENTION

This invention has been made having regard to the state of the art noted above, and its object is to provide a radiation detecting apparatus which suppresses creeping discharges due to a bias voltage applied to a radiation sensitive semiconductor layer.

The above object is fulfilled, according to this invention, by a radiation detecting apparatus having a radiation sensitive semiconductor layer for generating carriers, i.e. electron-hole pairs, in response to incident radiation, a voltage application electrode formed on a front surface of the semiconductor layer for receiving a bias voltage applied thereto, carrier collection electrodes formed on a back surface of the semiconductor layer, and charge storing capacitors and charge reading switching elements connected to the carrier collection electrodes, the switching elements being normally turned off, charges accumulating in the capacitors as a result of the incident radiation being read as radiation detection signals through the switching elements turned on, wherein:

the radiation sensitive semiconductor layer is a thick amorphous semiconductor layer;

a carrier selective high resistance film is formed between the thick amorphous semiconductor layer and the voltage application electrode to entirely cover a surface of the thick amorphous semiconductor layer; and an electrodeless region extends throughout a circumference of the thick amorphous semiconductor layer between edges of the voltage application electrode and edges of the thick amorphous semiconductor layer.

With the apparatus according to this invention, radiation to be detected is emitted while a bias voltage is applied to the voltage application electrode formed on the front surface of the radiation sensitive amorphous semiconductor layer. Then, charges accumulate in the charge storing capacitors connected to the carrier collection electrodes, in a quantity corresponding to the carriers generated by incident radiation in the amorphous semiconductor layer. As the charge reading switching elements are turned on, the charges having accumulated are read as radiation detection signals through the switching elements.

Thus, when detecting radiation, the carrier selectivity of the carrier selective high resistance film blocks an injection of those carriers (electrons or holes) not contributing to the detection of radiation but becoming dark currents, thereby to suppress dark currents. An injection of the carriers that contribute to the detection of radiation is not blocked, thereby to maintain signal response characteristics.

The surface of the amorphous semiconductor layer is completely covered by the carrier selective high resistance film. This construction prevents crystallization due to moisture and the like of the amorphous semiconductor layer to avoid lowering of the surface resistance. In addition, the electrodeless region is formed throughout the circumference between edges of the voltage application electrode and edges of the amorphous semiconductor layer. The voltage application electrode is surrounded by the carrier selective high resistance film having a high surface resistance. Since sufficient surface voltage endurance is provided between the voltage application electrode and the grounding side, creeping discharges from the radiation sensitive amorphous semiconductor layer due to the bias voltage are suppressed. Consequently, sufficient detection sensitivity is secured by applying a high bias voltage.

In the apparatus according to this invention, the carrier collection electrodes may be formed in a large number and arranged in a two-dimensional matrix, each of the carrier collection electrodes having one each of the charge storing capacitors and the charge reading switching elements to constitute a two-dimensional array structure. Then, each radiation detecting unit is capable of locally detecting radiation, to enable measurement of a two-dimensional distribution of radiation intensity.

Where the carrier selective high resistance film is a p-type conducting film, a negative bias voltage is applied to the voltage application electrode. This prevents an injection of electrons that do not contribute to the detection of radiation but become dark currents. An injection of holes that contribute to the detection of radiation is allowed, thereby to detect radiation reliably.

Where the carrier selective high resistance film is an n-type conducting film, a positive bias voltage and the n-type carrier selective high resistance film prevent an injection of holes that do not contribute to the detection of radiation but become dark currents, and allows an injection of electrons that contribute to the detection of radiation. Thus, radiation may be detected reliably.

Further, the electrodeless region, preferably, has a width in a range of B mm to 3 B mm, B being a numerical value when an absolute value of the bias voltage is expressed in kV (kilovolt). With the width of the electrodeless region set to the above preferred range, sufficient surface voltage endurance is secured for inhibiting creeping discharges due to the bias current reliably. The above range does not substantially diminish the sensitive area (i.e. size of the detecting area) of the amorphous semiconductor layer. Thus, the creeping discharges due to the bias voltage are suppressed, and at the same time full use is made of the amorphous semiconductor layer suited for realizing an enlarged area.

In the apparatus according to this invention, the thick amorphous semiconductor layer, preferably, has a thickness in a range of 0.5 mm to 1 mm. With the thickness of the amorphous semiconductor layer set to the above preferred range, radiation is absorbed sufficiently by the semiconductor layer without passing therethrough. Preferably, the thick amorphous semiconductor layer is formed of amorphous selenium (a-Se). The thick amorphous selenium layer is particularly suited for realizing an enlarged detection area.

The carrier selective high resistance film, preferably, has a surface resistance of at least $10^8\Omega/\square$. With the surface resistance of the carrier selective high resistance film set to the above preferred value, creeping discharges are suppressed by the high surface resistance.

The carrier selective high resistance film, preferably, has a thickness in a range of 0.01 $\mu$m to 10 $\mu$m. With the thickness of the carrier selective high resistance film set to the above preferred range, an injection of unwanted carriers is inhibited while sufficiently allowing an injection of required carriers.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

Preferred embodiments of this invention will be described in detail hereinafter with reference to the drawings.

First Embodiment

Figure 1:
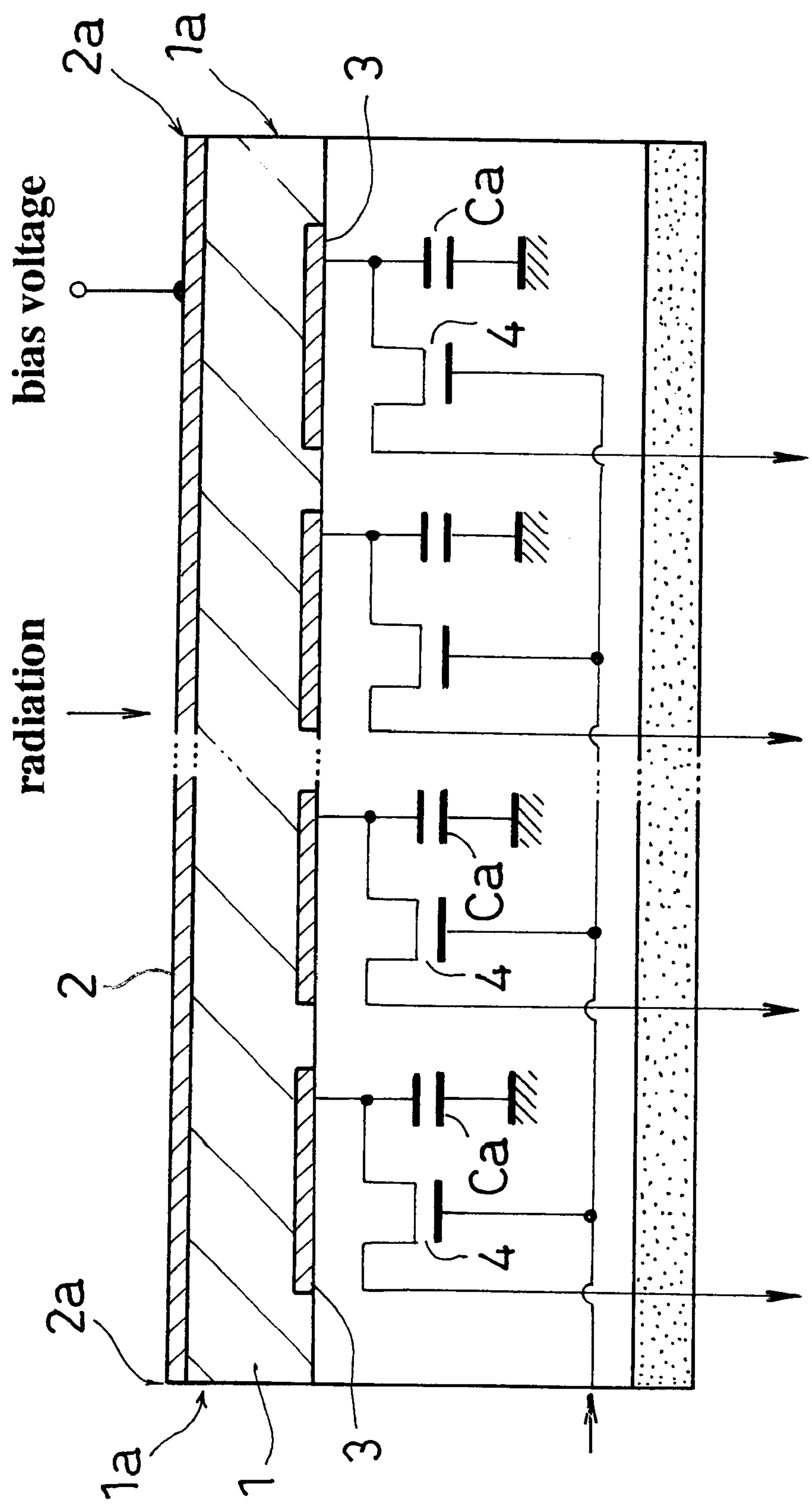
FIG. 1 is a schematic sectional view showing a principal portion of a conventional radiation detecting apparatus.
Figure 2:
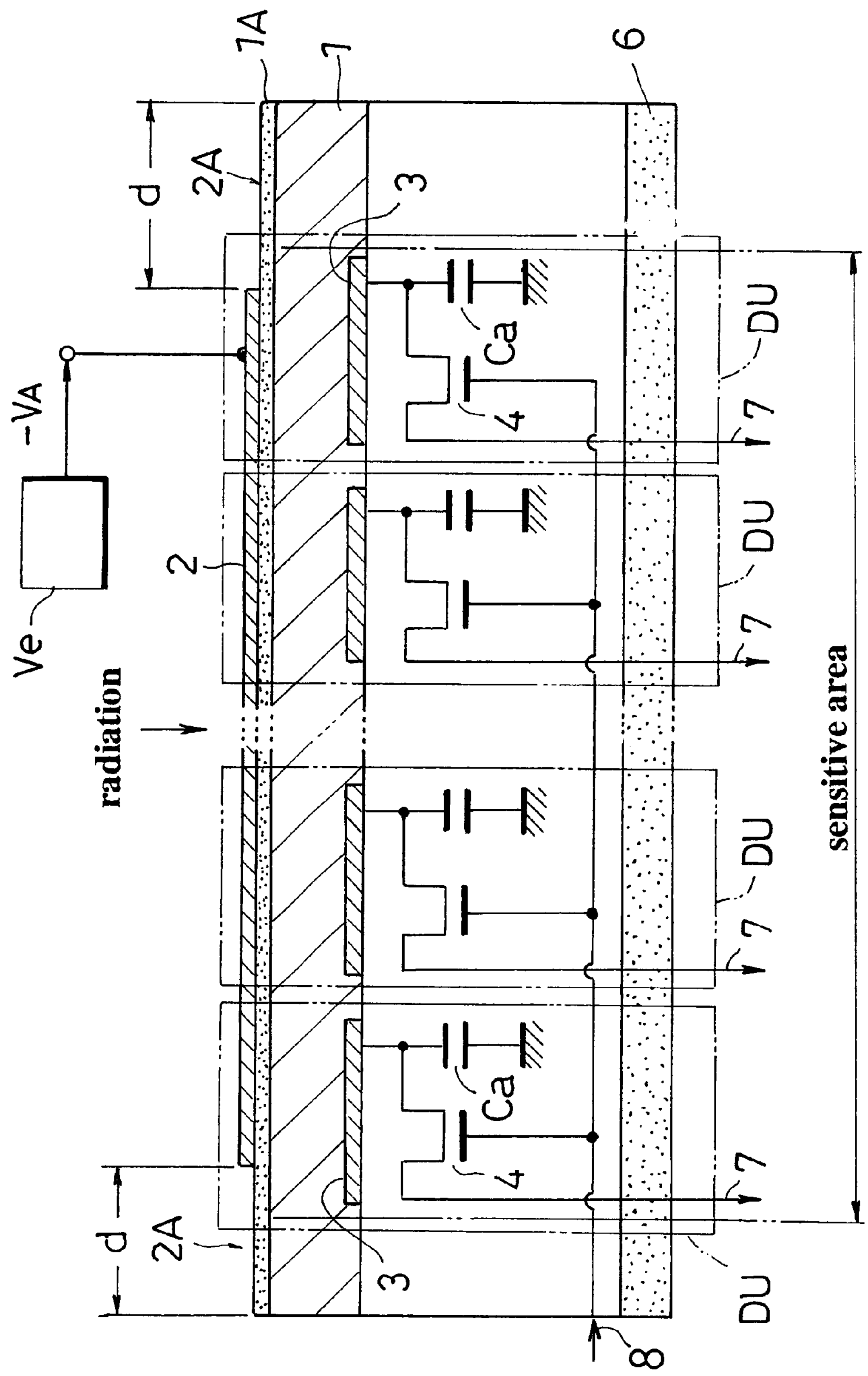
FIG. 2 is a schematic sectional view showing a radiation sensor in a first embodiment of this invention.
Figure 3:
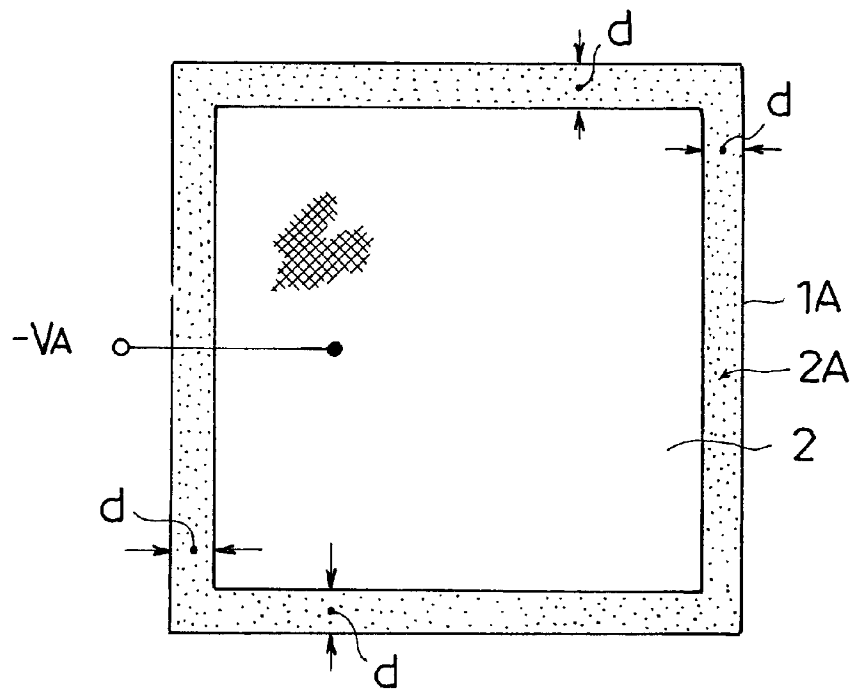
FIG. 3 is a plan view of the radiation sensor in the first embodiment.
Figure 4:
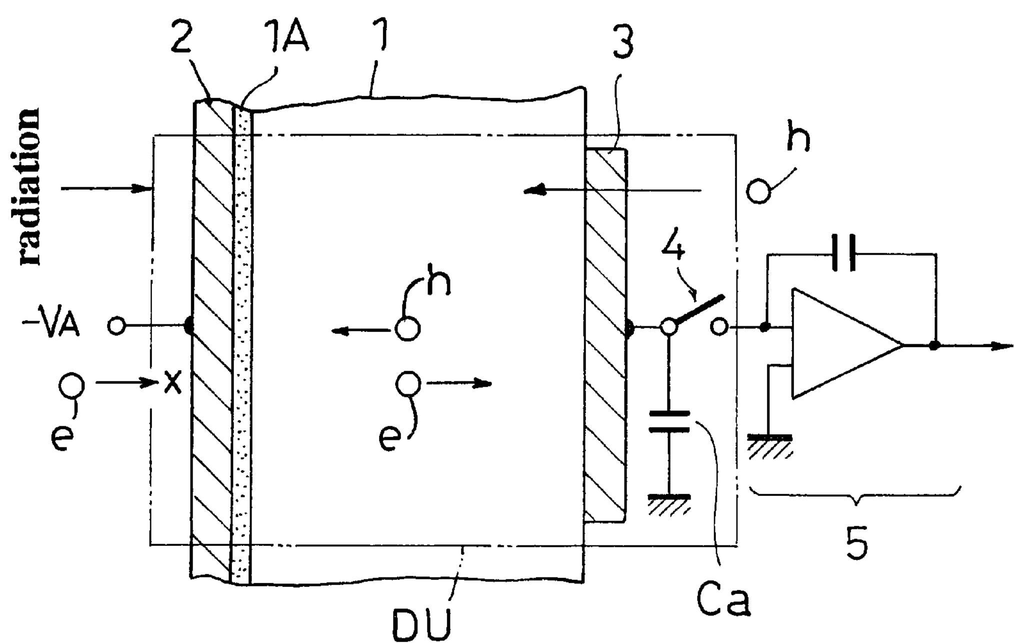
FIG. 4 is an explanatory view showing a detecting operation of a radiation detecting unit in the first embodiment.
Figure 5:
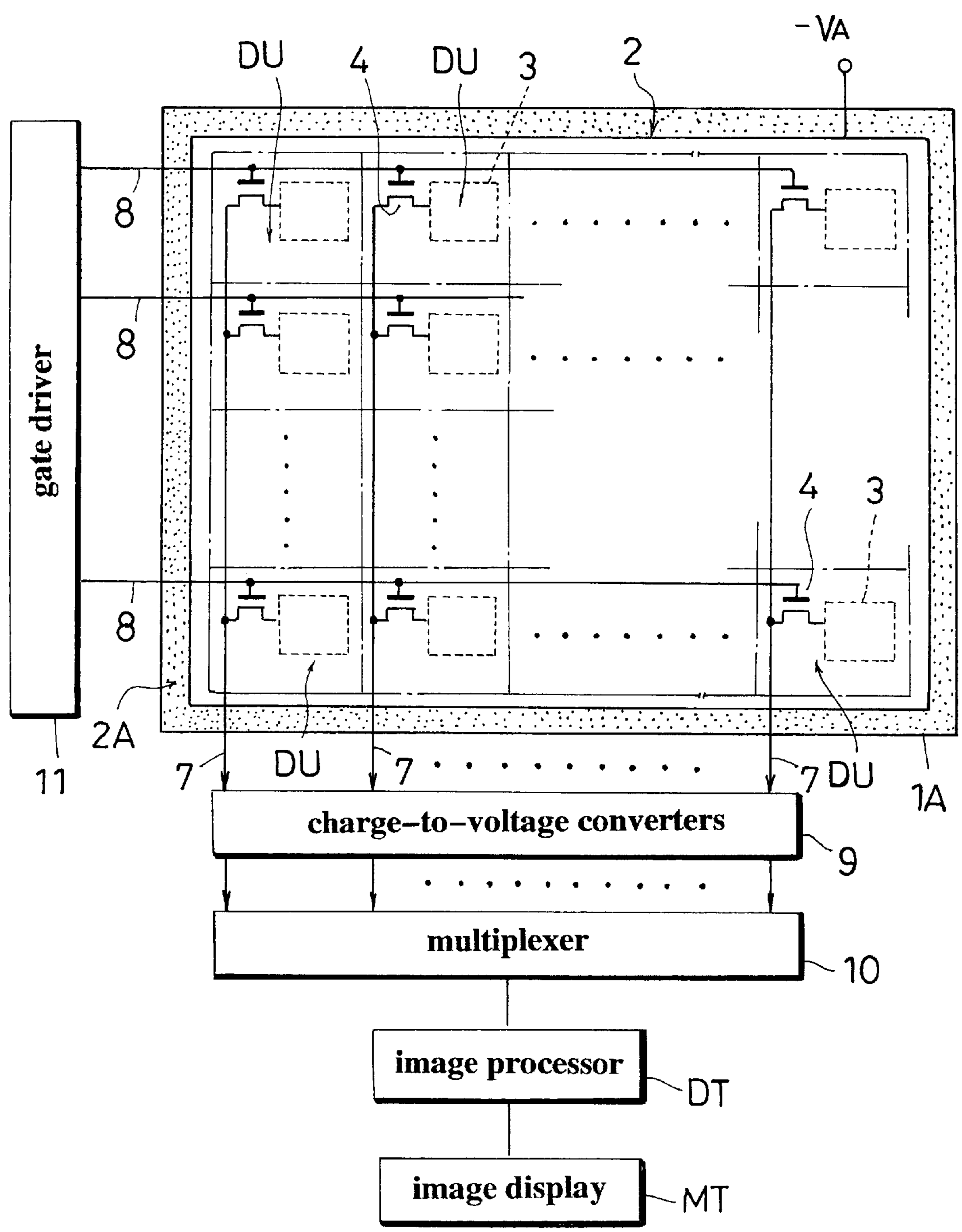
FIG. 5 is a block diagram showing an entire apparatus in the first embodiment.

FIG. 2 is a schematic sectional view showing a radiation sensor of a radiation detecting apparatus in a first embodiment. FIG. 3 is a plan view of the radiation sensor in the first embodiment. FIG. 4 is an explanatory view showing a detecting operation of a radiation detecting unit in the first embodiment. FIG. 5 is a block diagram showing an entire apparatus in the first embodiment.

As shown in FIG. 2, the radiation detecting apparatus in the first embodiment includes a radiation sensor having a thick, radiation sensitive amorphous semiconductor layer 1 for generating carriers in response to incident radiation (e.g. X rays), a voltage application electrode 2 disposed on a front surface, i.e. a radiation incidence side, of semiconductor layer 1, carrier collection electrodes 3 arranged on a back surface, i.e. a radiation non-incidence side (opposite from the radiation incidence side), of semiconductor layer 1, charge storing capacitors Ca for storing carriers collected by the carrier collection electrodes 3, and thin film transistors (TFT) acting as switching elements 4, which are normally turned off (non-conductive), for taking out the charges stored in the capacitors Ca. The apparatus in the first embodiment further includes a bias voltage supply (power source) Ve for applying a negative bias voltage $-V_A$ to the voltage application electrode 2. The carriers generated by incident radiation, with the bias voltage applied to the voltage application electrode 2, are transferred from the carrier collection electrodes 3 to the capacitors Ca to accumulate therein. In time of reading, the switching elements 4 are turned on (connected) whereby the charges are read as radiation detection signals. Each component will particularly be described hereinafter.

In the apparatus in the first embodiment, the thick amorphous semiconductor layer 1 is a high purity amorphous selenium (a-Se) layer having a high specific resistance of $10^9\Omega$cm or more (preferably $10^{11}\Omega$cm or more), and a thickness of 0.5 mm to 1 mm. The thick amorphous selenium layer 1 is particularly suited for realizing an enlarged detection area. The amorphous semiconductor layer 1, preferably, is as thick as 0.5 mm to 1 mm, since radiation would just pass through a thin layer without being sufficiently absorbed therein.

The voltage application electrode 2 and carrier collection electrodes 3 may be formed of a metal selected from Au, Pt, Ni, In and the like, or ITO. Of course, the amorphous semiconductor and electrodes are not limited to the materials cited above.

As shown in FIG. 2, the apparatus in the first embodiment includes, as a characterizing feature thereof, a p-type carrier selective high resistance film 1A formed between the amorphous semiconductor layer 1 and voltage application electrode 2 to cover the entire surface of amorphous semiconductor layer 1. As shown in FIG. 3, an electrodeless region 2A extends throughout the circumference, with a uniform width d, between the edges of voltage application electrode 2 and the edges of amorphous semiconductor layer 1.

The p-type carrier selective high resistance film 1A, preferably, has a surface resistance (sheet resistance) of $10^8\Omega/\square$ or more, and a film thickness of 0.01 $\mu$m to 10 $\mu$m (usually in the order of 0.1 $\mu$m). The film 1A may suitably be formed of $Sb_2S_3$, SbTe, ZnTe, CdTe or AsSe, or may be an organic film. A film thickness less than 0.01 $\mu$m would make it difficult to inhibit an injection of unwanted carriers. A film thickness exceeding 10 $\mu$m would tend to hamper an injection of required carriers. It is preferred that the carrier selective high resistance film 1A covers the amorphous semiconductor layer 1 entirely (100%). However, for expediency of manufacturing or the like, small edge portions of the semiconductor layer 1 may remain uncovered.

According to a confirmation made by Inventor through experiment, the width d of the electrodeless region, preferably, is in the range of B mm to 3 B mm. In the above range, B is a numerical value when an absolute value of the bias voltage applied by the bias voltage supply Ve is expressed in kV (kilovolt). Where, for example, the carrier selective high resistance film 1A is sized 500 mm long and 500 mm wide, the bias voltage usually is applied at −10, 000V (=−10 kV). In this case, since the absolute value of "−10" is 10, B is 10 and thus the width d of the electrodeless region is in the range of 10 mm to 30 mm.

As shown in FIG. 2, the radiation sensor of the apparatus in the first embodiment includes thin film transistors (of the FET type) acting as the switching elements 4 and the charge storing capacitors Ca, besides the amorphous semiconductor layer 1 and electrodes 2 and 3, all formed on one insulating substrate 6. The capacitors Ca are in the form of $SiO_2$ layers or the like. The insulating substrate 6 is in the form of a glass substrate or the like.

Further, as shown in FIGS. 2 and 5, the radiation sensor of the apparatus in the first embodiment has numerous carrier collection electrodes 3 arranged in a two-dimensional matrix. Each carrier collection electrode 3 has one charge storing capacitor Ca and one charge reading switching element 4, to constitute one radiation detecting element DU acting as a radiation detecting unit. Numerous such radiation detecting elements are arranged along X- and Y-directions (e.g. 1024×1024) to form a flat panel radiation sensor (area sensor) of two-dimensional array structure.

That is, the voltage application electrode 2 is formed throughout as a common electrode for all the detecting elements DU. The carrier collection electrodes 3 are arranged in a two-dimensional matrix as individual electrodes for the respective detecting elements DU. Each carrier collection electrode 3 has one charge storing capacitor Ca and one charge reading switching element 4 connected thereto. Thus, each radiation detecting unit is capable of locally detecting radiation, to enable measurement of a two-dimensional distribution of radiation intensity.

In the radiation sensor in the first embodiment, as shown in FIGS. 2 and 5, the thin film transistors forming the switching elements 4 of detecting elements DU have drains thereof connected to sense lines 7 arranged in the horizontal (X) direction, and gates connected to sense lines 8 arranged in the vertical (Y) direction. The sense lines 7 are connected to a multiplexer 10 through a group of charge-to-voltage converters (group of preamplifiers) 9. The sense lines 8 are connected to a gate driver 11. In the charge-to-voltage converter group 9, one charge-to-voltage converter 5 as shown in FIG. 4 is connected to each sense line 7.

In the radiation sensor in the first embodiment, scan signals for fetching signals are inputted to the multiplexer 10 and gate driver 11. The detecting elements DU of the radiation sensor are identified by means of addresses (e.g. 0 to 1023) sequentially allocated to the detecting elements DU along the X- and Y-directions. Thus, the fetching scan signals serve as signals designating the addresses in the X-direction or Y-direction.

In response to scan signals for the Y-direction, the gate driver 11 applies a fetching voltage to the sense lines 8 arranged in the Y-direction. Then, detecting elements DU are selected on a column-by-column basis. When, the multiplexer 10 is switched by scan signals for the X-direction, the charges stored in the capacitors Ca of the detecting elements DU in the selected columns are successively outputted through the charge-to-voltage converter group 9 and multiplexer 10.

Where the radiation detecting apparatus in the first embodiment is used as an X-ray detector of a fluoroscopic apparatus, for example, detection signals of the detecting elements DU as shown in chain lines in FIG. 5 are successively taken out of the multiplexer 10 as pixel signals. Then, an image processor DT performs a necessary signal processing including a noise processing, and an image display MT displays a two-dimensional image (fluoroscopic image).

Thus, the detection signal fetching mode of the radiation sensor in the first embodiment can be said broadly similar to that of ordinary imaging devices such as TV cameras.

In the first embodiment, the radiation sensor may include an analog-to-digital converter (not shown), as necessary, in addition to the charge-to-voltage converter group 9, multiplexer 10 and gate driver 11, to promote an integrated construction. However, the charge-to-voltage converter group 9, multiplexer 10, gate driver 11 and the analog-to-digital converter may wholly or partly be installed separately.

In fabricating the radiation sensor in the first embodiment, the thin film transistors for switching elements 4, capacitors Ca, carrier collection electrodes 3, amorphous semiconductor layer 1, carrier selective high resistance film 1A and voltage application electrode 2 are successively laminated on a surface of insulating substrate 6 by using the thin film forming technique based on one of various vacuum deposition methods or the pattern forming technique based on a photolithographic method.

A radiation detecting operation of the radiation detecting apparatus in the first embodiment will be described next with reference to FIG. 4. For detecting radiation with the apparatus in the first embodiment, as shown in FIG. 4, radiation to be detected is emitted while a negative (minus) bias voltage ($-V_A$) is applied. This bias voltage has a polarity for moving holes h, among the carriers generated by incident radiation, toward the voltage application electrode 2 on the front surface of amorphous semiconductor layer 1.

On the one hand, the carrier selectivity of p-type carrier selective high resistance film 1A blocks the injection of electrons e that do not contribute to the detection of radiation but become dark currents, thereby to suppress dark currents. The injection of holes h that contribute to the detection of radiation is not blocked, thereby to maintain signal response characteristics. The thick amorphous semiconductor layer 1, with the high specific resistance, suppresses also the dark currents due to holes h, thereby to suppress total dark currents to a very low level.

On the other hand, holes h contributing to the detection of radiation (and not causing dark currents) are injected through the carrier collection electrode 3 in a large quantity corresponding to the carriers generated by incident radiation, to secure sufficient detection sensitivity. With the generation and injection of holes h, charges accumulate in the charge storing capacitors Ca connected to the carrier collection electrodes 3. As the charge reading switching elements 4 are turned on, the charges having accumulated are read as radiation detection signals through the switching elements 4, and then converted into voltage signals by the charge-to-voltage converters 5.

Further, in the radiation detecting apparatus in the first embodiment, as shown in FIG. 3, the surface of amorphous semiconductor layer 1 is completely covered by the carrier selective high resistance film 1A. This construction prevents crystallization due to moisture and the like of the amorphous semiconductor layer 1 to avoid lowering of the surface resistance. In addition, the electrodeless region 2A is formed throughout the circumference between the edges of voltage application electrode 2 and the edges of amorphous semiconductor layer 1. The voltage application electrode 2 is surrounded by the carrier selective high resistance film 1A having a high surface resistance. Since sufficient surface voltage endurance is provided between the voltage application electrode 2 and the grounding side, creeping discharges due to the bias voltage ($-V_A$) are suppressed.

As noted above, the width d of the electrodeless region, preferably, is in the range of B mm to 3B mm. This range does not substantially diminish the sensitive area (i.e. size of the detecting area) of amorphous semiconductor layer 1 while securing the surface voltage endurance for inhibiting creeping discharges reliably. Thus, the creeping discharges due to the bias voltage are suppressed, and at the same time full use is made of the amorphous semiconductor layer 1 suited for realizing an enlarged area. That is, the width d of the electrodeless region less than B mm would reduce the length of the carrier selective high resistance film 1A with a high surface resistance and surrounding the voltage application electrode 2, which would make it difficult to secure sufficient insulating voltage endurance. Conversely, where the width d of the electrodeless region limiting the radiation detecting area exceeds 3B mm, the amorphous semiconductor layer 1 will have a reduced sensitive area (i.e. size of the detecting area).

To confirm that creeping discharges are actually suppressed with the apparatus in the first embodiment, a radiation detecting apparatus similar to the radiation detecting apparatus in the first embodiment was constructed for testing purposes. Specifically, the test apparatus was constructed using an a-Se layer having a thickness of 500 $\mu$m as the amorphous semiconductor layer 1, a $Sb_2S_3$ film having a thickness in the order of 0.1 $\mu$m as the carrier selective high resistance film 1A, the voltage application electrode 2 being formed on the front surface of amorphous semiconductor layer 1, leaving the electrodeless region with width d of 5 mm, and the carrier collection electrodes 3 being formed on the back surface of amorphous semiconductor layer 1. Further, a radiation detecting apparatus was constructed for comparison purposes, which was similar to the test radiation detecting apparatus, except that the carrier selective high resistance film 1A was not formed.

Figure 6:
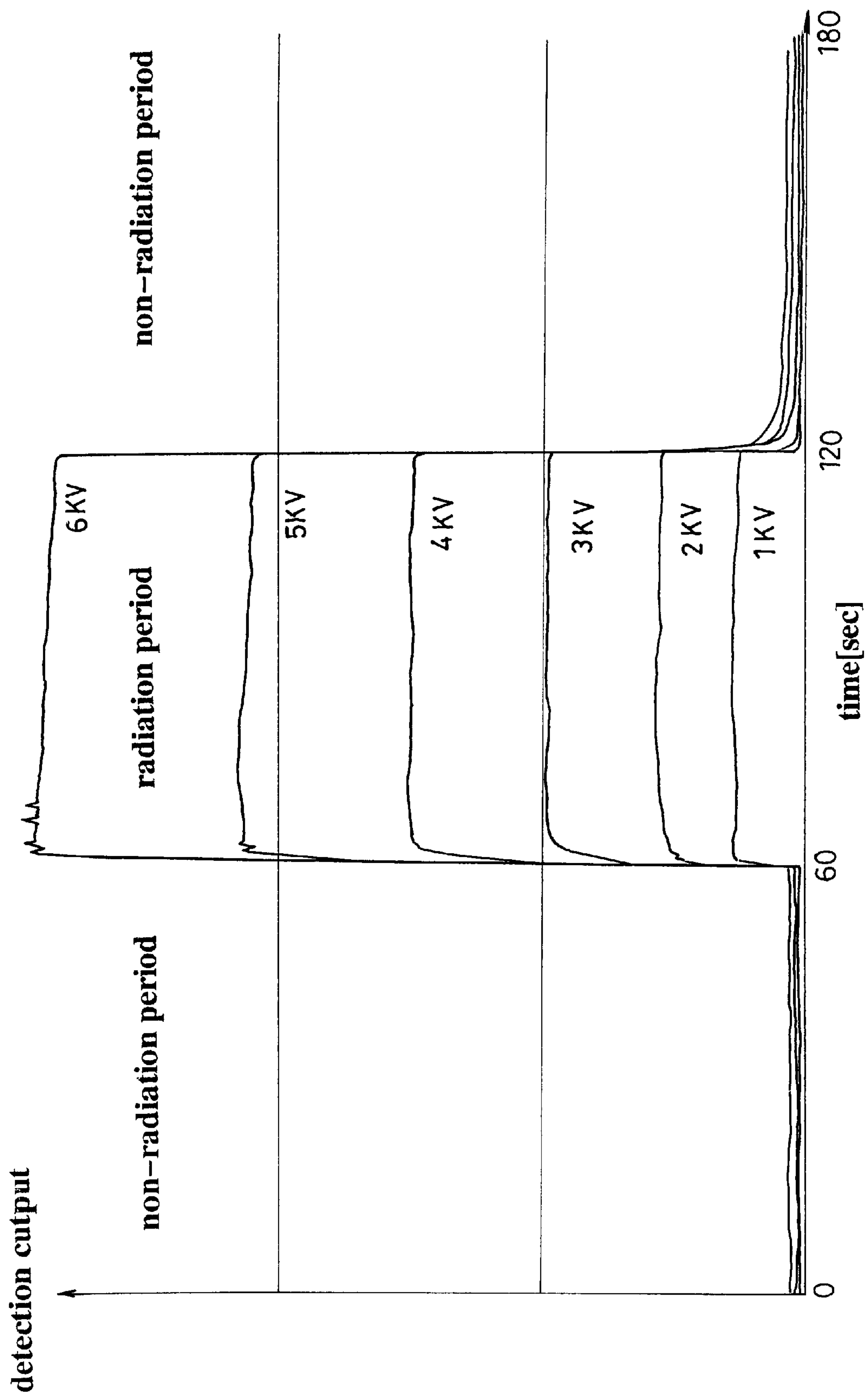
FIG. 6 is a graph showing time-dependent changes of detection output of a radiation detecting apparatus used for testing.
Figure 7:
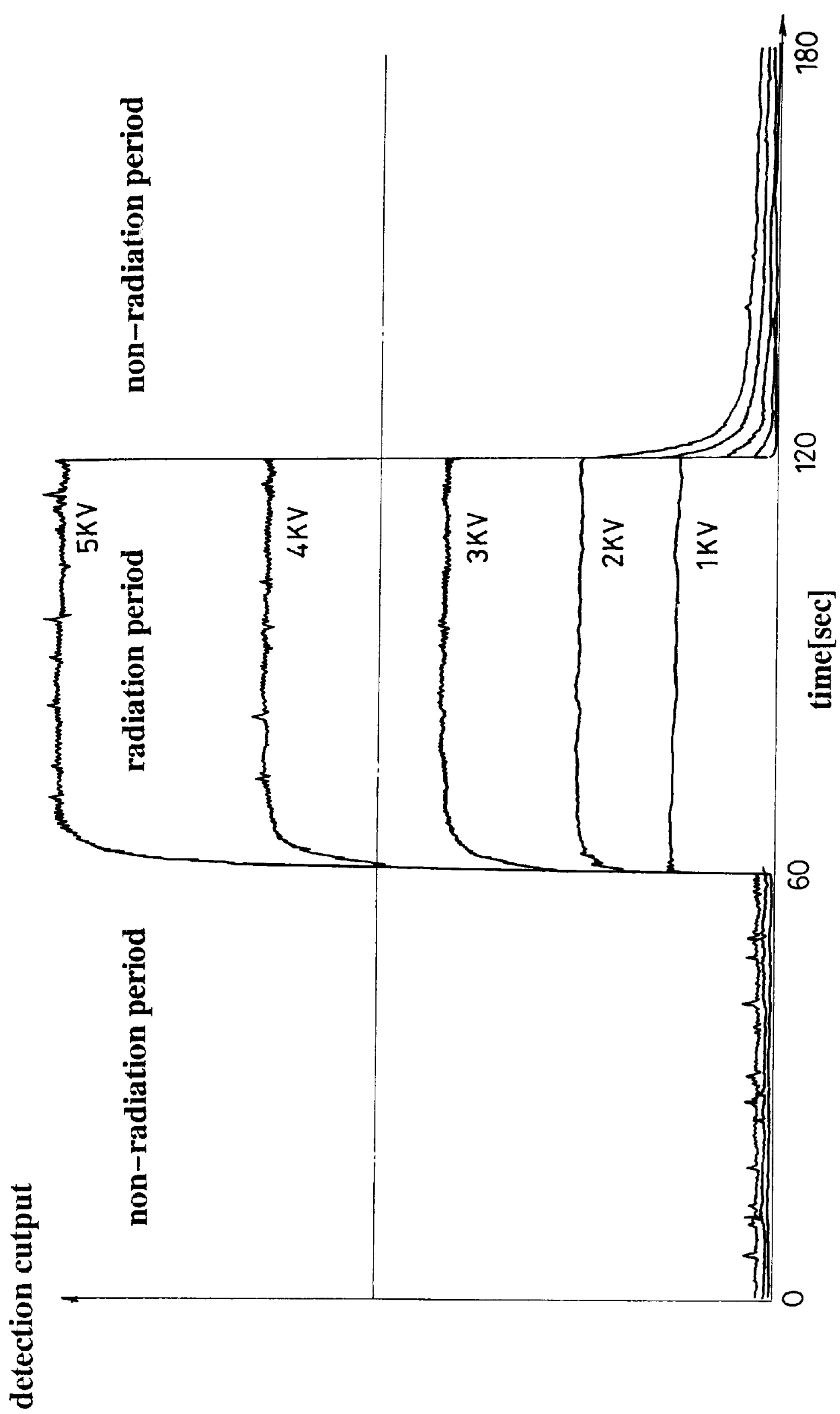
FIG. 7 is a graph showing time-dependent changes of detection output of a radiation detecting apparatus used for comparison.

A negative bias voltage of 1 kV was applied to the voltage application electrode 2 of each of the test and comparative radiation detecting apparatus, and detection outputs (current values) of the carrier collection electrodes 3 were measured while an emission of radiation (X rays) was continued from 60 seconds to 120 seconds after a start of bias voltage application. FIG. 6 shows measurement results from the test radiation detecting apparatus. FIG. 7 shows measurement results from the comparative radiation detecting apparatus. Next, similar measurement was repeated while increasing the bias voltage in steps of 1 kV. The measurement was carried out for the test radiation detecting apparatus with bias voltages up to 6 kV, and for the comparative radiation detecting apparatus with bias voltages up to 5 kV.

With the test radiation detecting apparatus, as shown in FIG. 6, creeping discharges appear as a tuft-like pulse current for the first time when the bias voltage of −6 kV is applied. With the comparative radiation detecting apparatus, as shown in FIG. 7, creeping discharges frequently appear as a sharp tuft-like pulse current already when the bias voltage of −3 kV is applied.

These results show that creeping discharges may be inhibited sufficiently by covering the surface of amorphous semiconductor layer 1 with the carrier selective high resistance film 1A as in the radiation detecting apparatus in the first embodiment.

In FIG. 6, creeping discharges do not occur yet with the bias voltage of 5 kV. It will be seen that, where the absolute value of the bias voltage is B kV (e.g. 5 kV), creeping discharges may be inhibited reliably by setting the width d of the electrodeless region to B mm (e.g. 5 mm) or more. Further, the detection outputs are nearly zero even with increases in the bias voltage in time of non-irradiation, which clearly indicates that dark currents are suppressed sufficiently. The detection outputs increase in a corresponding relationship with the bias voltage, which indicates that sufficient detection sensitivity is secured by applying a high bias voltage.

Second Embodiment

Figure 8:
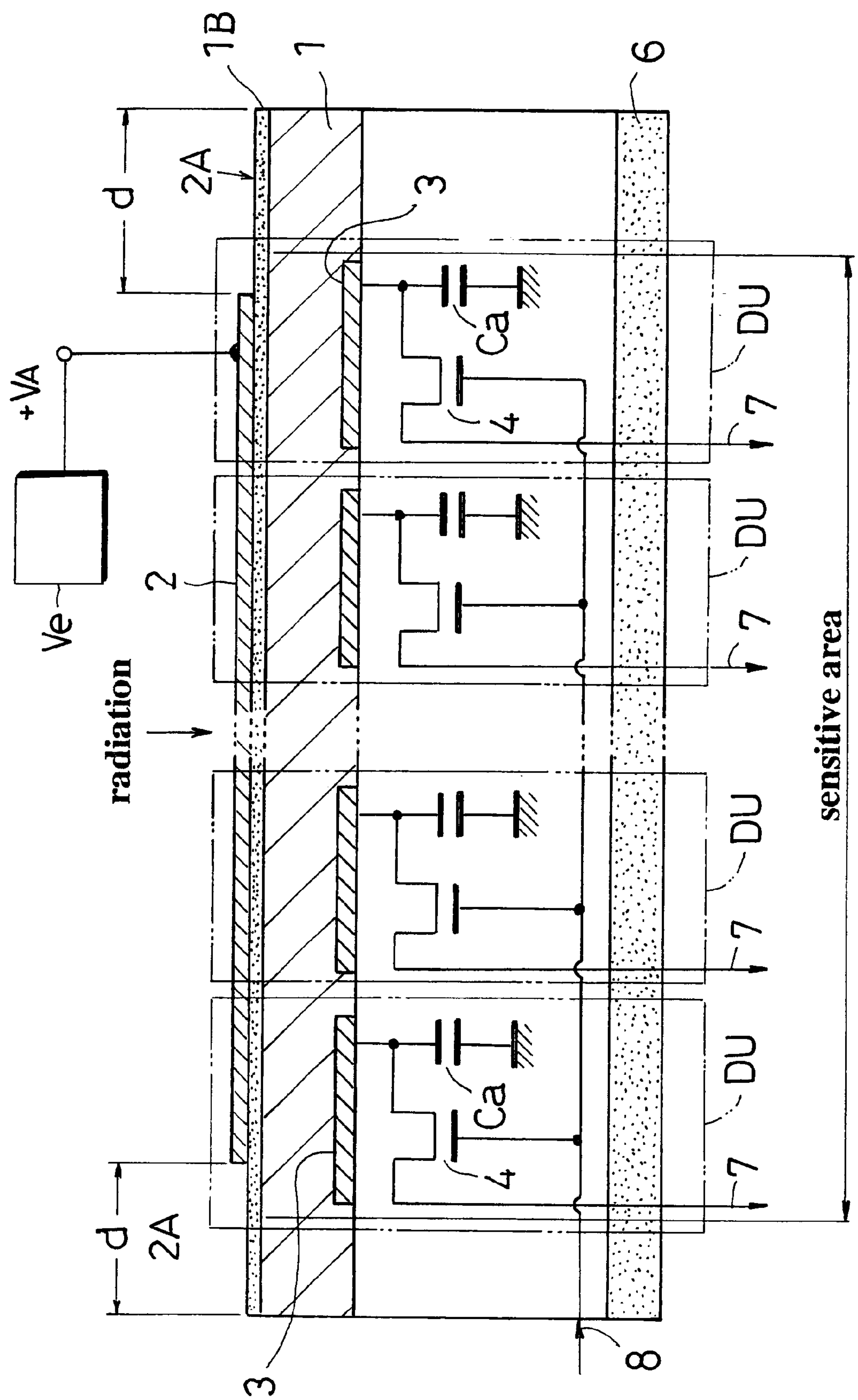
FIG. 8 is a schematic sectional view showing a radiation sensor in a second embodiment of this invention.
Figure 9:
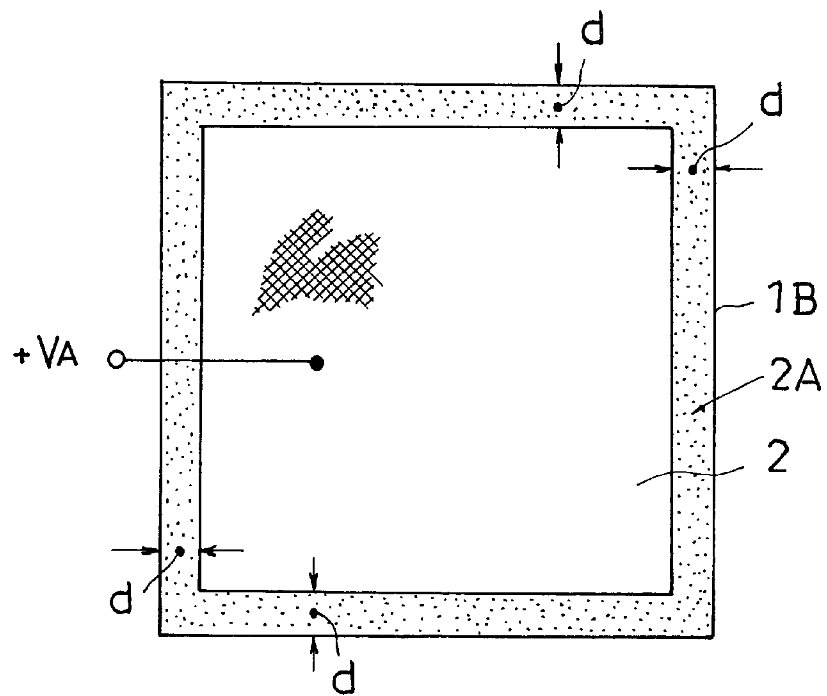
FIG. 9 is a plan view of the radiation sensor in the second embodiment.
Figure 10:
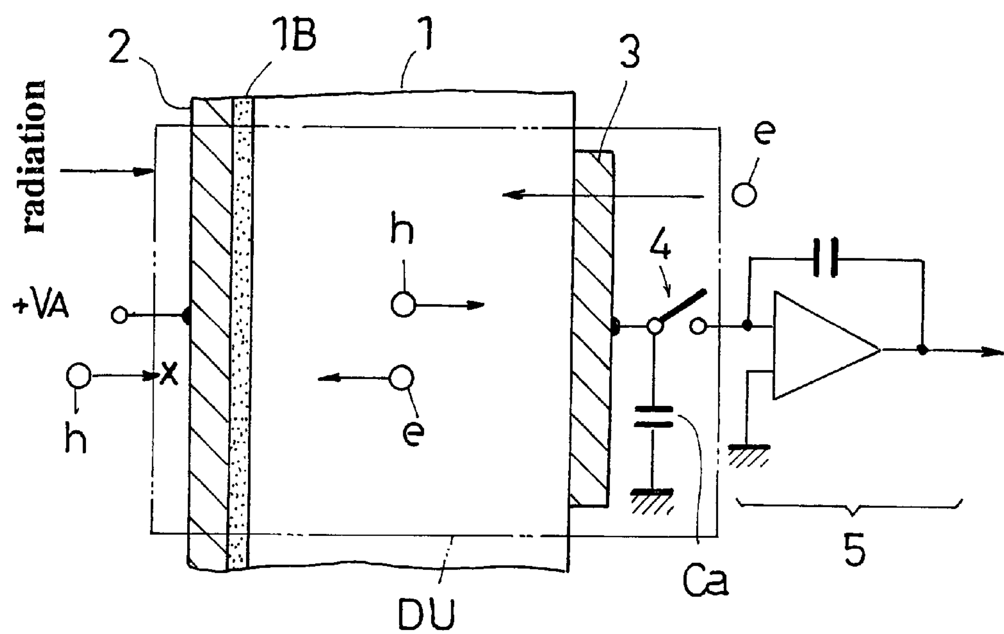
FIG. 10 is an explanatory view showing a detecting operation of a radiation detecting unit in the second embodiment.

FIG. 8 is a schematic sectional view showing a radiation sensor of a radiation detecting apparatus in a second embodiment. FIG. 9 is a plan view of the radiation sensor in the second embodiment. FIG. 10 is an explanatory view showing a detecting operation of a radiation detecting unit in the second embodiment.

As shown in FIGS. 8 through 10, the radiation detecting apparatus in the second embodiment includes, between the amorphous semiconductor layer 1 and voltage application electrode 2, an n-type carrier selective high resistance film 1B which is the conducting type opposite to the p-type in the first embodiment. As shown in FIG. 8, a positive bias voltage $V_A$ is applied to the voltage application electrode 2. In the other aspects, the apparatus in this embodiment is the same as the apparatus in the first embodiment. Only the different aspects will be described hereinafter. The n-type carrier selective high resistance film 1B, preferably, has a surface resistance (sheet resistance) of $10^8 \Omega/\square$ or more, and a film thickness of 0.01 $\mu$m to 10 $\mu$m (usually in the order of 0.1 $\mu$m). The film 1B may suitably be formed of CdS or $CeO_2$.

For detecting radiation with the apparatus in the second embodiment, as shown in FIG. 10, radiation to be detected is emitted while a positive (plus) bias voltage ($+V_A$) is applied. This bias voltage has a polarity for moving electrons e, among the carriers generated by incident radiation, toward the voltage application electrode 2 on the front surface of amorphous semiconductor layer 1.

On the one hand, the carrier selectivity of n-type carrier selective high resistance film 1B blocks the injection of holes h that do not contribute to the detection of radiation but become dark currents, thereby to suppress dark currents. The injection of electrons e that contribute to the detection of radiation is not blocked, thereby to maintain signal response characteristics. The thick amorphous semiconductor layer 1, with the high specific resistance, suppresses also the dark currents due to electrons e, thereby suppressing total dark currents.

On the other hand, electrons e contributing to the detection of radiation (and not causing dark currents) are injected through the carrier collection electrode 3 in a large quantity corresponding to the carriers generated by incident radiation, to secure sufficient detection sensitivity. With the generation and injection of electrons e, charges accumulate in the charge storing capacitors Ca connected to the carrier collection electrodes 3. As the charge reading switching elements 4 are turned on, the charges having accumulated are read as radiation detection signals through the switching elements 4, and then converted into voltage signals by the charge-voltage converters 5.

In the radiation detecting apparatus in the second embodiment also, as shown in FIG. 9, the surface of amorphous semiconductor layer 1 is completely covered by the carrier selective high resistance film 1B. This construction prevents crystallization due to moisture and the like of the amorphous semiconductor layer 1 to avoid lowering of the surface resistance. In addition, an electrodeless region 2A is formed throughout the circumference between the edges of voltage application electrode 2 and the edges of amorphous semiconductor layer 1. The voltage application electrode 2 is surrounded by the carrier selective high resistance film 1B having a high surface resistance. Since sufficient surface voltage endurance is provided between the voltage application electrode 2 and the grounding side, creeping discharges due to the bias voltage (VA) are suppressed.

This invention is not limited to the embodiments describe above, but may be modified as follows:

(1) In the foregoing embodiments, the thick amorphous semiconductor layer is a thick, high purity a-Se layer. The thick amorphous semiconductor layer according to this invention may be a thick a-Se layer doped with As or Te having crystallization inhibiting action, or a thick amorphous semiconductor layer of an Se compound.

(2) In the foregoing embodiments, $Sb_2S_3$, SbTe, ZnTe, CdTe and AsSe are cited as examples of material for forming the p-type carrier selective high resistance film 1A, and CdS and $CeO_2$ as examples for forming the n-type carrier selective high resistance film 1B. The above combinations are not limitative since these high resistance films often become reversed conducting types depending on methods of formation. For example, $Sb_2S_3$ may be employed for the n-type carrier selective high resistance film 1B.

(3) In the foregoing embodiments, the electrodeless region formed between the edges of the voltage application electrode and the edges of the amorphous semiconductor layer has a uniform width throughout the circumference. The width of the electrodeless region need not be the same throughout the circumference, but may be varied in certain locations. However, where the electrodeless region has varied widths, the surface voltage endurance of the apparatus as a whole is determined by a surface voltage endurance in a location in which the width of the electrodeless region is small.

(4) The foregoing embodiments have been described as providing a two-dimensional array structure including numerous detecting elements DU arranged in a matrix form. This structure may be modified into a line sensor with a plurality of detecting elements DU arranged only in a column or row, or a structure having a single detecting element DU.

(5) The radiation detectable by the radiation detecting apparatus of this invention is not limited to X rays, but may be all types of radiation.

The present invention may be embodied in other specific forms without departing from the spirit or essential attributes thereof and, accordingly, reference should be made to the appended claims, rather than to the foregoing specification, as indicating the scope of the invention.

What is claimed is:

1. A radiation detecting apparatus having a radiation sensitive semiconductor layer for generating carriers, i.e. electron-hole pairs, in response to incident radiation, a voltage application electrode formed on a front surface of the semiconductor layer for receiving a bias voltage applied thereto, carrier collection electrodes formed on a back surface of the semiconductor layer, and charge storing capacitors and charge reading switching elements connected to the carrier collection electrodes, the switching elements being normally turned off, charges accumulating in the capacitors as a result of the incident radiation being read as radiation detection signals through the switching elements turned on, wherein:

said radiation sensitive semiconductor layer is an amorphous semiconductor layer;

a carrier selective high resistance film is formed between said amorphous semiconductor layer and said voltage application electrode to entirely cover a surface of said amorphous semiconductor layer; and an electrodeless region of said carrier selective high resistance film extends throughout a circumference of said amorphous semiconductor layer between edges of said voltage application electrode and edges of said amorphous semiconductor layer.

2. A radiation detecting apparatus as defined in claim 1, wherein said carrier selective high resistance film is a p-type conducting film, and a negative bias voltage is applied to said voltage application electrode.

3. A radiation detecting apparatus as defined in claim 1, wherein said carrier selective high resistance film is an n-type conducting film, and a positive bias voltage is applied to said voltage application electrode.

4. A radiation detecting apparatus as defined in claim 1, wherein said electrodeless region has a width in a range of B mm to 3 B mm, B being a numerical value when an absolute value of the bias voltage is expressed in kV (kilovolt).

5. A radiation detecting apparatus as defined in claim 1, wherein said carrier collection electrodes are formed in a large number and arranged in a two-dimensional matrix, each of said carrier collection electrodes having one each of said charge storing capacitors and said charge reading switching elements to constitute a two-dimensional array structure.

6. A radiation detecting apparatus as defined in claim 1, wherein said thick amorphous semiconductor layer has a thickness in a range of 0.5 mm to 1 mm.

7. A radiation detecting apparatus as defined in claim 1, wherein said thick amorphous semiconductor layer is formed of amorphous selenium.

8. A radiation detecting apparatus as defined in claim 1, wherein said carrier selective high resistance film has a surface resistance of at least $10^8 \Omega/\square$.

9. A radiation detecting apparatus as defined in claim 1, wherein said carrier selective high resistance film has a thickness in a range of 0.01 $\mu$m to 10 $\mu$m.

10. A radiation detecting apparatus as defined in claim 1, wherein one or more of $Sb_2S_3$, SbTe, ZnTe, CdTe and AsSe, CdS, and $CeO_2$ are selected as material for forming said carrier selective high resistance film.

* * * * *